(12) United States Patent
Tavabi et al.

(10) Patent No.: US 10,276,345 B2
(45) Date of Patent: Apr. 30, 2019

(54) TUNABLE AMPERE PHASE PLATE FOR CHARGED PARTICLE IMAGING SYSTEMS

(71) Applicant: Forschungszentrum Juelich GmbH, Juelich (DE)

(72) Inventors: Amir Hossein Tavabi, Juelich (DE); Aleksei Savenko, Juelich (DE); Giulio Pozzi, Bologna (IT); Rafal Edward Dunin-Borkowski, Juelich (DE); Vadim Migunov, Aachen (DE)

(73) Assignee: Forschunszentrum Juelich GmbH, Juelich (DE)

( * ) Notice: Subject to any disclaimer, the term of this patent is extended or adjusted under 35 U.S.C. 154(b) by 0 days.

(21) Appl. No.: 15/500,425

(22) PCT Filed: Jul. 30, 2014

(86) PCT No.: PCT/EP2014/002080
§ 371 (c)(1),
(2) Date: Jan. 30, 2017

(87) PCT Pub. No.: WO2016/015739
PCT Pub. Date: Feb. 4, 2016

(65) Prior Publication Data
US 2017/0229283 A1    Aug. 10, 2017

(51) Int. Cl.
*H01J 37/26*    (2006.01)
(52) U.S. Cl.
CPC ....... *H01J 37/26* (2013.01); *H01J 2237/2614* (2013.01)

(58) Field of Classification Search
CPC ........................................................ H01J 37/26
See application file for complete search history.

(56) References Cited

U.S. PATENT DOCUMENTS

| 4,935,625 A | 6/1990 | Hasegawa et al. | |
| 5,814,815 A * | 9/1998 | Matsumoto | H01J 37/26 250/311 |

(Continued)

FOREIGN PATENT DOCUMENTS

| EP | 2660844 A1 | 11/2013 |
| JP | H6-333529 A | 12/1994 |
| JP | H06333529 A | 12/1994 |

OTHER PUBLICATIONS

Scott Hughes Feb. 3, 2005 Massachusetts Institute of Technology Department of Physics 8.022 Spring 2005 Lecture 2: Electric fields & flux; Gauss's law.*

(Continued)

*Primary Examiner* — Nicole M Ippolito
*Assistant Examiner* — Sean M Luck
(74) *Attorney, Agent, or Firm* — Norris McLaughlin, P.A.

(57) ABSTRACT

A phase shifting device for a charged particle imaging system includes means for passing an electric current in a direction that has a nonzero component parallel to at least one section of the imaging beam. Preferably, the electric current is passed parallel along the section of the imaging beam. The amount of phase shift then centrosymmetrically depends on the distance between the electric current axis and the imaging beam axis. The magnetic field produced by the electric current exhibits the same effect on the phase of the beam as a localized charge according to the prior art.

13 Claims, 16 Drawing Sheets

(56) References Cited

U.S. PATENT DOCUMENTS

| | | | |
|---|---|---|---|
| 2008/0035854 A1 | 2/2008 | Jin et al. | |
| 2009/0168142 A1* | 7/2009 | Nagayama | H01J 37/26 359/279 |
| 2010/0038537 A1 | 2/2010 | Benner | |
| 2012/0241612 A1* | 9/2012 | Harada | H01J 37/1478 250/311 |
| 2014/0124664 A1* | 5/2014 | Fukuda | H01J 37/153 250/310 |
| 2014/0326876 A1* | 11/2014 | Buijsse | H01J 37/263 250/307 |

OTHER PUBLICATIONS

G. Ballosier, et al.; "Use of an electrostatic phase plate in TEM. Transmission electron micrscopy: Improvement of phase and topographical contrast", Optik 58, No. 6 (1981) 361-376.

Robert M. Glaeser; "Inivted Review Article: Methods for imaging weak-phase objects in electron microscopy", Review of Scientific Instruments 84, 111101 (2013).

Kuniaki Nagayama; "Another 60 years in electron microscopy: development of phase-plate electron microscopy and biological applications", Journal of Electron Microscopy 60 (Supplement 1): S43-S62 (2011).

\* cited by examiner

TUNABLE AMPERE PHASE PLATE FOR CHARGED PARTICLE IMAGING SYSTEMS

BACKGROUND OF THE INVENTION

The invention relates to a tunable phase plate for charged particle imaging systems.

When an object is imaged using a beam of charged particles, particularly electrons, features in the object may provide contrast by influencing the intensity of the transmitted, reflected or scattered beam. Some features in the object do not influence the intensity but rather the phase of the beam. To transform the phase variation into an intensity variation, i.e. into useful image contrast, a phase plate can be used to introduce a phase difference between the beam that has interacted with the object and that which has not interacted.

Especially for transmission electron microscopy, various kinds of phase plates have been developed over the last decades. (K. Nagayama, "Another 60 years in electron microscopy: development of phase-plate electron microscopy and biological applications", Journal of Electron Microscopy 60 (Supplement 1), S43-S62 (2001)) gives a review. Most of those phase plates are literally plates of some non-conducting material that the beam has to pass; the phase change is brought about by the refractive index of this material, which changes the optical path length. The downside to such plates is that a charge accumulates on them, which influences the beam and de-grades the image.

(G. Balossier, N. Bonnet, "Use of an electrostatic phase plate in TEM. Transmission electron microscopy: Improvement of phase and topographical contrast", Optik 58, 361-376 (1981)) discloses a phase plate made of a very thin wire that is mounted perpendicular to the electron beam. Where the beam directly impinges on this wire, secondary electrons escape, creating a localized net positive charge that shifts the phase of the beam. Unfortunately, as pointed out in the review article (R. M. Glaeser, "Methods for imaging weak-phase objects in electron microscopy", Review of Scientific Instruments 84, 111101 (2013)), the amount of phase shift that such a configuration (and similar ones based on self-charging under the beam) produces cannot be understood with any available physical or mathematical model yet. Therefore, in most situations the performance of this kind of device will be detrimental rather than favourable on the image.

SUMMARY OF THE INVENTION

It is therefore the object of the invention to provide a phase shifting device for a charged particle imaging system that can be used to introduce a controllable and predictable amount of phase shift, while introducing minimal further disturbances of the imaging beam, as well as a charged particle beam imaging system including the phase shifting device.

The invention pertains to a phase shifting device for a charged particle imaging system, where the particles may especially be electrons. The characterizing feature of the phase shifting device according to the invention is that it comprises a means to pass an electric current in a direction that has a nonzero component parallel to at least one section of the imaging beam. The current is preferably passed in a straight line.

When the imaging beam passes the magnetic field that is generated by the electric current, in a simplified classical model, a Lorentz force will act on the charged particles. This Lorentz force is perpendicular on the direction of the imaging beam and on the direction of the magnetic field. This means that only a component of the magnetic field that lies in the plane perpendicular to the direction of the imaging beam will cause a deflection of the beam. For the field to have such a component, any electric current passed in a direction that has a nonzero component parallel to the beam will in principle do. Both the strength and the symmetry of the deflection, however, will depend on the angle enclosed between the direction of the imaging beam and the direction of the electrical current. If the direction of the current only has a very small component parallel to the direction of the imaging beam, a considerably higher amperage of the current is required in order to produce a noticeable deflection. Additionally, if the current is tilted with respect to the direction of the imaging beam, the magnetic field in the plane perpendicular to the beam will no longer be symmetric around the center of the phase shifting device.

The deflection of the charged particles changes their optical path length, which corresponds to a phase change.

The inventors have found that the magnetic field produced by the electric current exhibits the same effect on the phase of the beam as a localized charge according to the Balossier et al. prior art. Advantageously, because the relation between the current and the magnetic field is given by Ampère's Law and the effect of the vector potential corresponding to this magnetic field on the beam is well understood as the quantum mechanical Aharanov-Bohm effect, the amount of phase shift and its distribution in space are fully understood and predictable. This means that the invention provides a means to apply a pre-determined, specifically desired phase shift to the beam, which was not possible with the Balossier device.

The phase shift builds up gradually along the length of the section of the beam that is running alongside the electric current. The speed at which the phase shift builds up is a product of the time the beam spends running alongside the current and the amperage of the current. The time depends on the speed of the charged particles and therefore on the acceleration voltage of the beam. For a fixed acceleration voltage, the amperage is the main parameter to tune the phase difference.

Advantageously, because the phase shift builds up gradually, the quality of the phase shift does not depend very critically on the exact dimensions of the means to pass the current. If, e.g., a wire is used to pass the current, small statistical inhomogeneities or defects in the material or in the cross section of the wire may be averaged out. With the localized electric charge according to Balossier, everything depends on this one spot.

In an advantageous embodiment of the invention, the electric current is passed along the section of the imaging beam in a direction that encloses an angle of at most 45 degrees, preferably of at most 20 degrees and most advantageously of at most 10 degrees with that section of the imaging beam. This will produce a symmetry of the phase shift that is usable for most purposes, and limit the amount of current needed to produce the phase change. The more current is needed, the thicker a conductor carrying the current has to be and the higher the screening influence of this conductor is on the imaging beam. This is a classical trade-off.

The current can be a DC current to produce a static phase shift. The amperage of the current may be swept over a range to produce measurements as a function of the phase shift as a variable. The current may also be AC, or a DC current with an AC signal modulated on top of it. If there is an AC component present, an imaging signal can be passed, e.g., through a lock-in amplifier that extracts this known frequency and rejects a large amount of noise. Additionally, wobbling the phase shift with a low AC frequency can be used to tune the imaging parameters of the imaging system; this is, e.g., used in the alignment of FIB columns or electron microscopes.

It is possible with the invention to pass the current within the imaging beam, preferably within the center of the imaging beam, to obtain a most controllable and quantitatively predictable phase contrast. If the electric current is passed in an offset position with respect to the imaging beam, the symmetry center of the phase shift will change. This may add a special emphasis on topographical contrast features.

In another advantageous embodiment of the invention, the means for passing the current comprises a second charged particle beam—after all, any electrical current is just a stream of charge carriers. This second beam is not a solid object that will disturb the main imaging beam.

If the current is passed through an electric conductor in the direction of the electric current, preferably the leads to supply the current are disposed in an angle between 75 and 105 degrees to the direction of the imaging beam. The magnetic field produced by those leads is then almost perpendicular to the magnetic field used to influence the phase of the beam, so the phase shift is not significantly altered by the leads. Other angles may be favourable to provide the current through the leads with a component parallel to the main electric current, to fine-tune the phase shift of this main current.

The conductor is preferably axially symmetric around the direction of the electric current. If it is running exactly parallel to the beam direction, the phase shift will be axially symmetric around the conductor as well.

If the current is passed alongside the section of the beam with a tilt, then this symmetry will be distorted. For some applications, such a distortion may be intended.

In an advantageous embodiment of the invention, the conductor and/or the leads are made of non-ferromagnetic materials. They then do not produce an additional magnetic field that is superimposed on the phase shifting effect.

Making the phase plate from a thicker wire has several advantages: it is mechanically more robust, easier to fabricate and you may pass a larger current to generate a stronger magnetic field and hence a larger phase shift. Although a thicker wire will shadow the beam more, this can be compensated by adjusting the phase plate position. The best trade-off depends on the experimental set-up and the object to be investigated.

The leads may take any path to the conductor responsible for the phase shift. For example, they may be arranged antiparallel to each other, so that the leads and the conductor responsible for the phase shift form a U-shape, with the leads forming the side and the conductor forming the bottom. Alternatively, it is possible that in a projection of the two leads onto a plane perpendicular to the conductor, the second lead is a straight continuation of the first one. The assembly of the two leads and the conductor can then span the complete diameter of the beam aperture and be rigidly mounted on both sides of the aperture.

There may be several leads to input the current to the conductor and several leads to draw the current from the conductor on the return path. Each of these leads can then be made thinner to reduce the effect on the imaging. Multiple leads may also bring about more mechanical stability because the phase shifting device can be mounted on more anchor points in the imaging system.

In a further advantageous embodiment of the invention, the phase shifting device has means to adjust a tilt angle between the direction of the electric current and the imaging beam. Most preferably, these means can be manipulated while the imaging system, e.g. an electron microscope, is in operation. In this way, a small mechanic misalignment of the phase shifting device introduced during its manufacture or during its mounting into the imaging system can be nulled out.

In a further advantageous embodiment of the invention, the phase shifting device has means to heat a conductor that carries the electric current to at least 200° C. This will remove any residual contamination, which may cause unwanted electric fields, from the conductor, especially if the imaging system is operating in a vacuum. The conductor may be heated, e.g., by a power supply capable of supplying a larger current than intended for the phase change. The contamination may, e.g., be amorphous carbon that is deposited in an electron microscope on all surfaces that are exposed to the electron beam.

The invention also pertains to a charged particle beam imaging system, with a beam that is coherently split into one first part that interacts with the object to be investigated and one second reference part that does not interact with the object, a means to bring the two parts of the beam to interference after the first part has interacted with the object, and a phase shifting device in the path of at least one of the two parts of the beam. Both parts of the beam may be phase shifted, but by different amounts, to generate contrast.

The phase shifting device is the one previously explained according to the invention. All disclosure regarding the phase shifting device, especially regarding the tenability and predictability of the phase shift, is also valid for the imaging system. The imaging system may preferably be an electron microscope.

BRIEF DESCRIPTION OF THE DRAWINGS

In the following, the subject-matter of the invention is explained and confirmed experimentally using figures without limiting the scope of the invention. The following is shown.

DETAILED DESCRIPTION OF THE INVENTION

Figure 1:
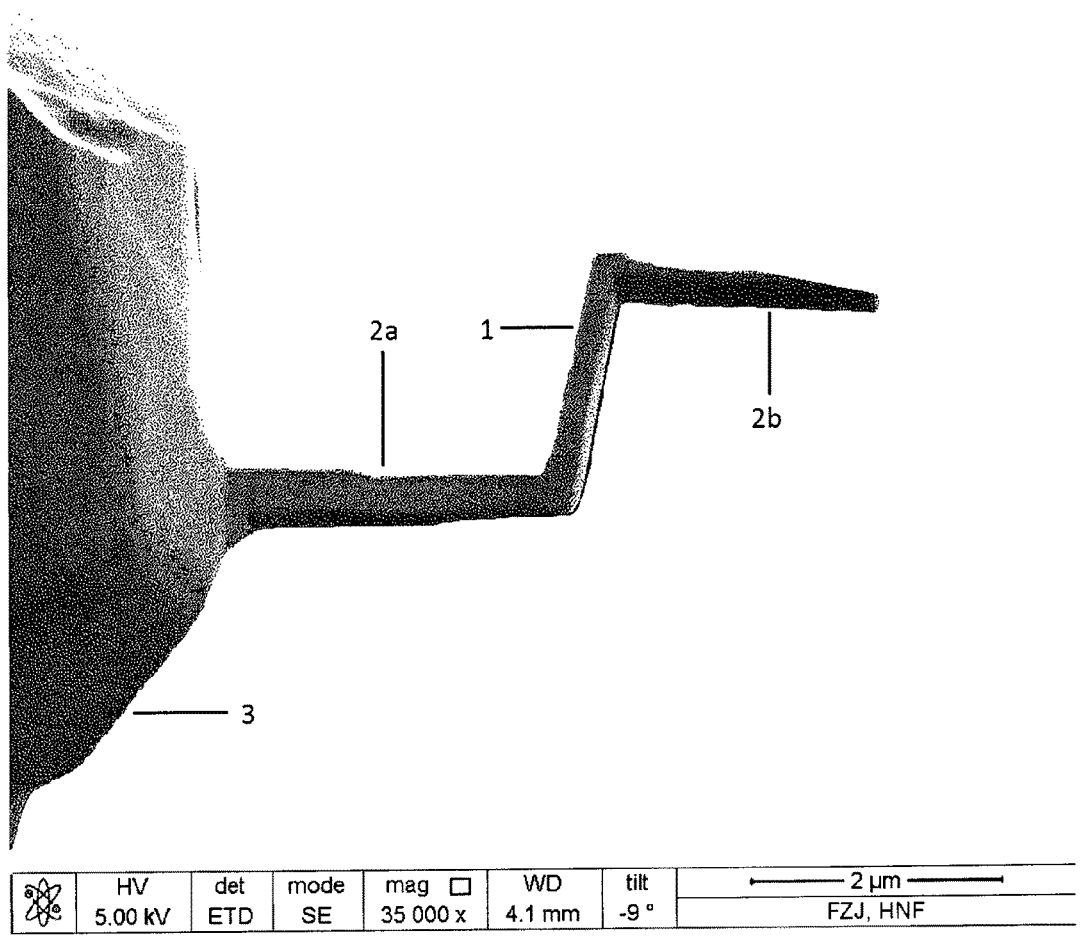
FIG. 1: Conductor and leads to pass a current parallel to the electron beam according to the present invention.

Electron holography is a powerful technique which, in the medium resolution range, is invaluable in the mapping and quantitative investigation of magnetic and electric fields.

Here we apply this technique to the study of the magnetic field produced by a vertical wire carrying a constant current, the closure of the electrical circuit being provided by two horizontal wires, whose magnetic field has a negligible effect on the electron optical phase shift, which are connected to an external voltage power supply. In situ experiments with varying currents are reported and compared to the theoretical predictions. It turns out that the phase shift associated to the electrical current has the same form of that produced by elementary charge.

Let us recall that the earliest attempts to make an electrostatic phase plate were based on the localized electrostatic charging of a thin wire with results judged of great interest but abandoned because the charging proved difficult to control. The same shortcoming is also shared by the recent idea of using the focalized, unscattered electron beam to create a localized spot of charging. According to Glaeser, there is no physical or mathematical (analytical) understanding of the amount of phase shift they produce, and their use is not recommended, as self-charging is something to be avoided rather than something that can be regarded as producing a useful result. We demonstrate that some, if not all, of these shortcomings can be amended and that a device based on our experiment can be profitably used as a tunable phase plate.

The starting motivation of this work was the high challenge represented by the generation of magnetic fields to study switching processes in magnetic materials in the transmission electron microscope (TEM). As a result of the fact that a current owing parallel to the plane of an untilted TEM specimen produces no net magnetic phase shift, we examine a short nano-fabricated segment of wire that is oriented parallel to the electron beam direction. Different regions of such a wire could in principle be used to apply either in-plane or out-of-plane magnetic fields to closely-adjacent nanomagnets.

However, we soon realized that the experiment has more profound meaning and implications: in fact, like elementary electrostatic charges and magnetic dipoles, a straight current line is the building block of any electrical circuit, according to the Ampere law. To our knowledge, no electron microscopy study exists regarding the investigation of the magnetic field associated to a linear wire carrying a constant current, as in the past the main focus was on the production of coils for the investigation of the Aharonov-Bohm effect.

Taking advantage of the new specimen preparation methods using Focused Ion Beam (FIB) and of the fact that electron holography has become a standard technique with modern field emission, aberration corrected, electron microscopes, we have considered under which conditions the experiment was feasible. The results of our work are illustrated in the following.

A free-standing three dimensional nanoscale circuit was created using focused ion beam (FIB) milling technique. A chemically etched gold wire was sculpted in two orthogonal directions to form a hook shape device in which the central segment 1 (will be called hook arm from now) will be set parallel to the optic axis of the microscope (FIG. 1). At the final step of milling under 7 pA the desired cross section of the hook arm at 200×200 nm$^2$ was achieved in a length of 2 µm. The hook arm 1 is hanging on the block 3 of Au from which it was machined by a first lead 2a. The second lead 2b is extending out of the top end of the hook arm 1 to the right-hand side. In the experiment, current was fed into the lead 2a through the gold block 3. The return path of the current was out of the lead 2b through another etched Au needle that was brought into contact with the lead 2b (not shown in FIG. 1). Leads 2a and 2b are substantially perpendicular to the hook arm 1, so that they do not interfere with the phase shift effect brought about by the current through the hook arm 1.

FIB milling was performed in a dual beam system Helios NanoLab 600i workstation operated at 30 kV by Ga+ ions and varying beam currents of 60 nA to 7 pA at different steps on milling procedure.

The hook and needle were mounted in a NanoFactory scanning tunneling microscopy specimen holder. Applying the piezo-driven STM tip of the holder a metallic contact was made at the end of the hook and tip of the needle. Current-voltage characteristic of the whole device showed an Ohmic contact with a total resistance of 22 ohm. Also by acquiring I-V curve in a blanked beam condition, it was confirmed that the illuminating electron beam has no effect on the contact properties and total resistance of the system.

Figure 2:
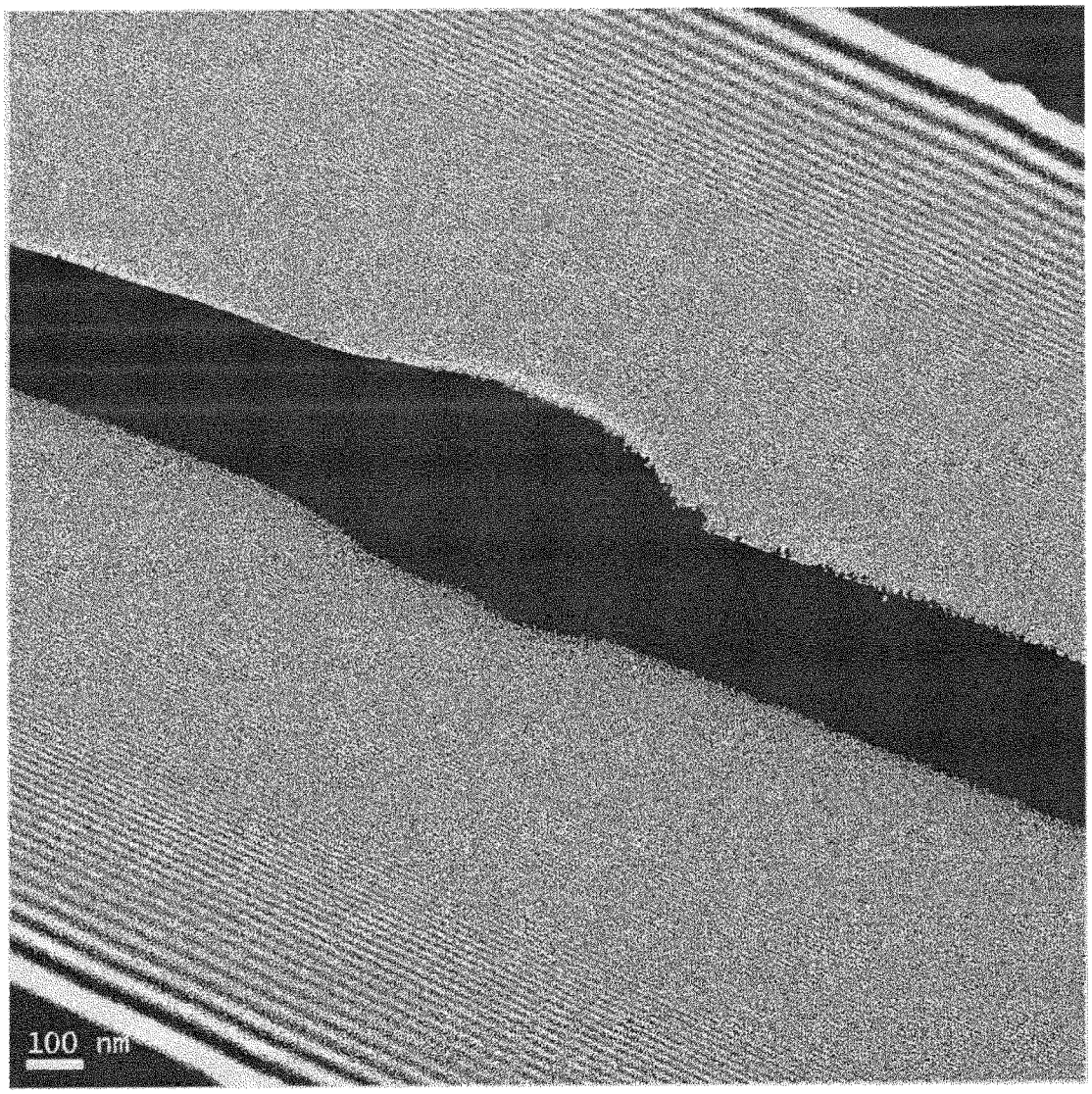
FIG. 2: Holographic view of the phase shift brought about by the hook arm 1.

Electron holography measurements were carried out to realize, detect and quantitatively measure the phase shift in electron wave. An elliptical probe was formed in a FEI Titan 60-300 TEM equipped with an XFEG field emission gun and two electron biprisms. Observations were performed in the Lorentz mode in a magnetic-field-free environment (with the conventional microscope objective lens switched off). The microscope was operated at 300 kV during the experiment and the upper biprism was used to form an interference region allowing to obtain a holographic field of view with a 2.4 µm width (FIG. 2). The opaque projection of the hook arm 1 is visible in FIG. 2 as a black bar that is running through the center of the image. All phase images where reconstructed from acquired holograms using HoloWorks 5.0 plugin made by Gatan Inc.

Figure 3A:
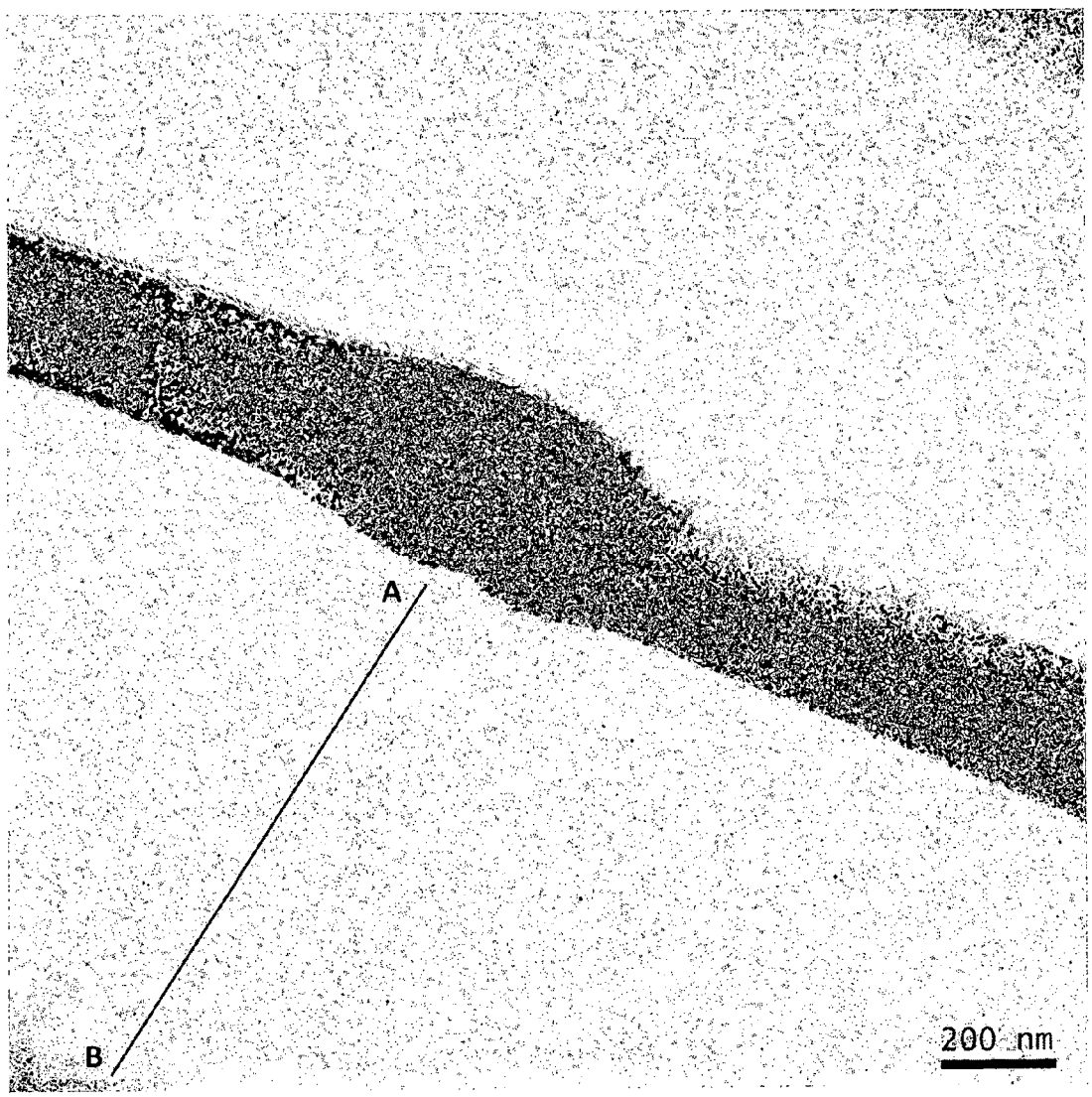
FIG. 3: Amplified interferograms showing different phase changes for currents 0 mA (FIG. 3a), 2 mA (FIG. 3b) and 4 mA (FIG. 3c) through the hook arm 1.
Figure 3B:
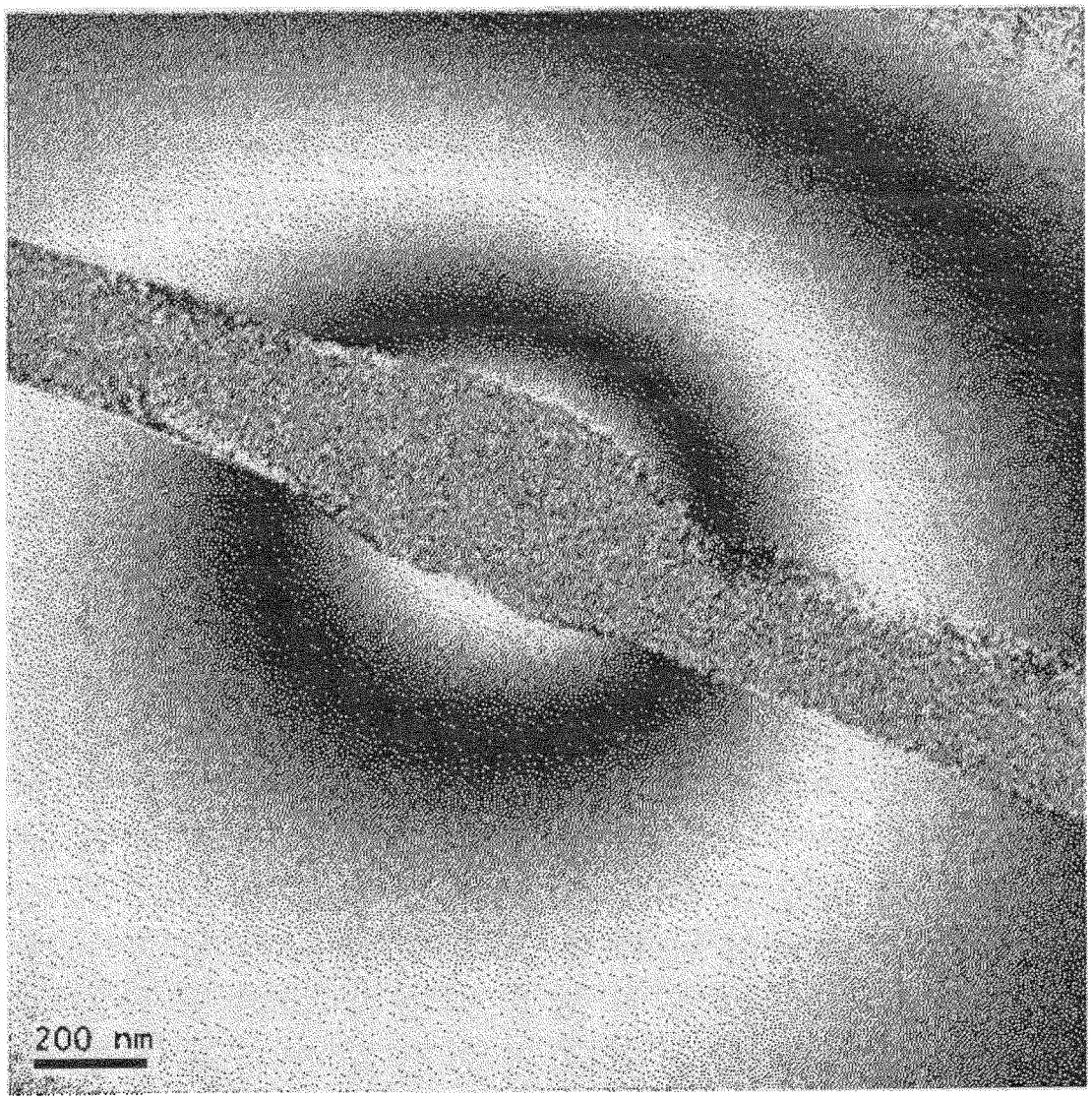
Figure 3C:
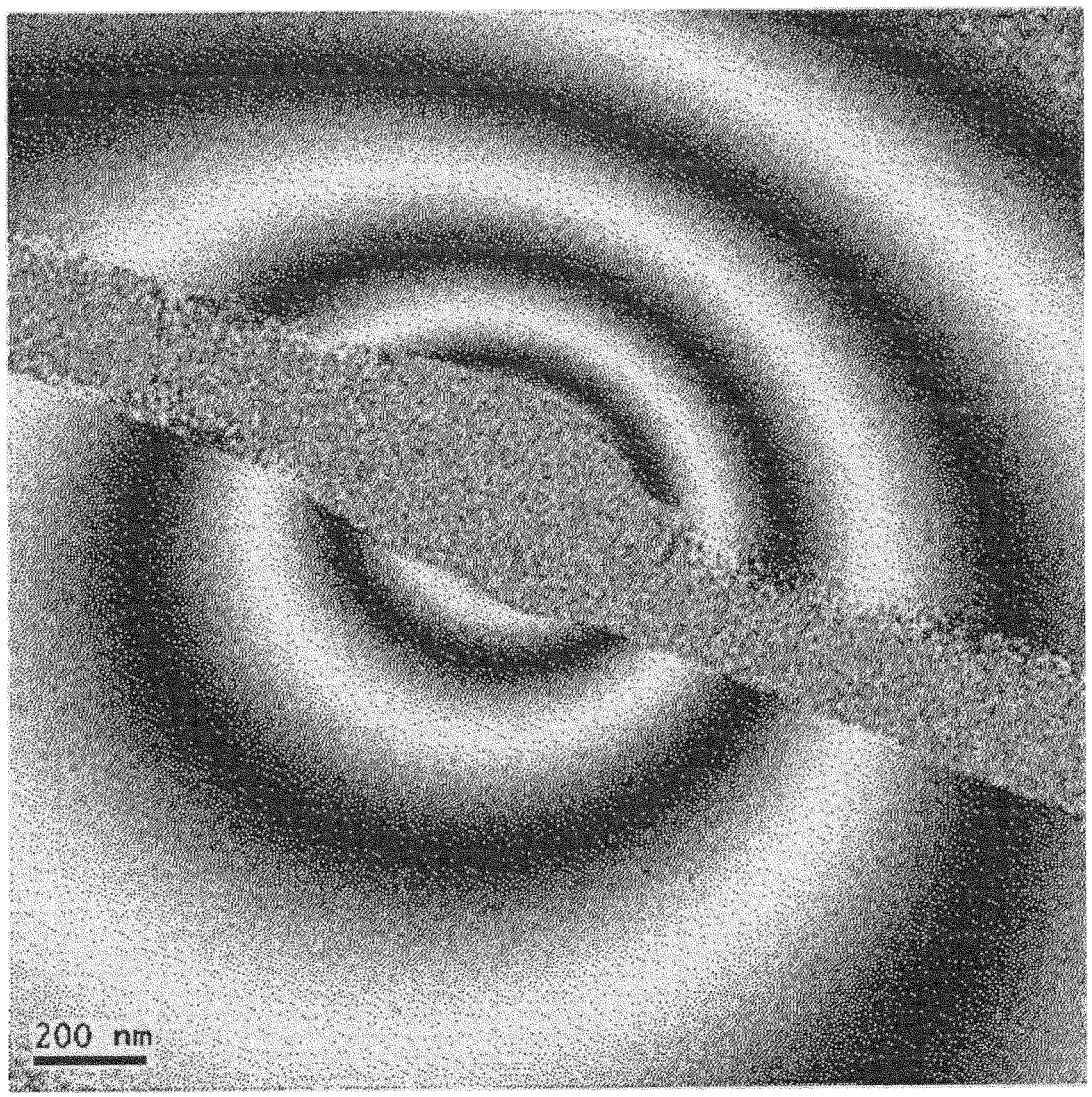

FIG. 3a-c shows the four times amplified cosine contour maps, (i.e, reporting 1+Cos(4 Δφ) with φ being the phase shift) of the reconstructed holographic images of the region around the hook arm taken at different, constant currents. The opaque projection of the hook arm 1 is shown in each of FIGS. 3a-c as a slightly wider noise-filled bar running through the center of the image. In FIG. 3a the phase image giving rise to the shown cosine map had been reconstructed from two holograms recorded when no current was passing through the device. Essentially, the contour map shows no variation in two dimensions across the hook implying that neither magnetic nor electric field are present around the device. In FIG. 3b the cosine map of the phase shifted electron wave due to the magnetic field around the hook arm is shown when a nominal current as high as 2 mA is passing through this nano-device. Semi-circular rings in this image represent the projected magnetic field around this segment of the device and have been revealed as the phase shift in transmitted electron beam. Indeed, two holograms were acquired when a constant current of 1 mA was passing through the arm segment but at different directions. It was found that currents parallel and anti-parallel to the electron beam will cause a magnetic field of the same power but of opposite sign as expected in principle. Hence, reconstructing two holograms in reverse magnetic field will result in a phase image with a doubled magnetic phase shift in the phase of the electron wave.

One time increasing of the current will of a factor of 2 results in a magnetic phase shift due to the 4 mA current around the hook arm as illustrated in FIG. 3c.

Comparing the amplified cosine contour maps in FIG. 3b and c, it is obvious that the power of the magnetic field has been raised two times higher when there is a flow of current equivalent to 4 mA with respect to the current of 2 mA, which is in consistence with Ampère law and will be discussed more in detail in the next section. In the holographic contour maps, starting from the center and proceeding radially outside, each change from dark to bright and vice versa corresponds to a fixed amount of phase change equal to π. In FIG. 3c, the frequency of those changes has doubled compared with FIG. 3b, indicating that the amount of phase change has also doubled.

It can be found that there is a considerable difference in size and shape of the rings at the two sides of the hook device. This feature is attributed to the perturbed reference wave. As is well-known in electron holographic observations, the long range electric and magnetic fields that are inevitably present in the electron microscope perturb the reference wave and produce distortions that are visible in holography studies. We will take this effect into account and will discuss it in the next sections. FIGS. 4 a-c report the theoretically simulated magnetic phase shift profiles of the electron wave at the same constant currents as used in FIG. 3a, b and c (0, 2 and 4 mA, respectively) displayed as 4 times amplified cosine contour maps. The opaque projection of the hook arm 1 was assumed to be running from left to right and is visible as a white bar. As expected there is no phase shift in the profile of 0 mA current.

However, it can be seen that the phase shift values increase two times when the current rose up from 2 to 4 mA. Also, it is obvious that the phase shifts are unequal at two sides of the hook which shows the relative effect of the perturbed reference wave presence in hologram formation with respect to the position of electron biprism.

Figure 5A:
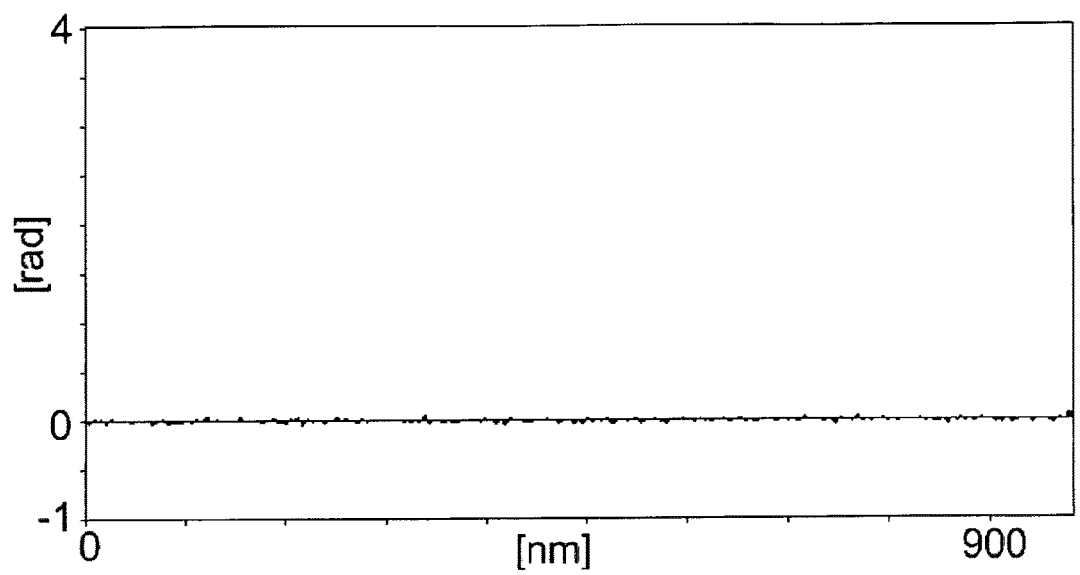
FIG. 5: Line scans through the phase patterns shown in FIG. 3.
Figure 5B:
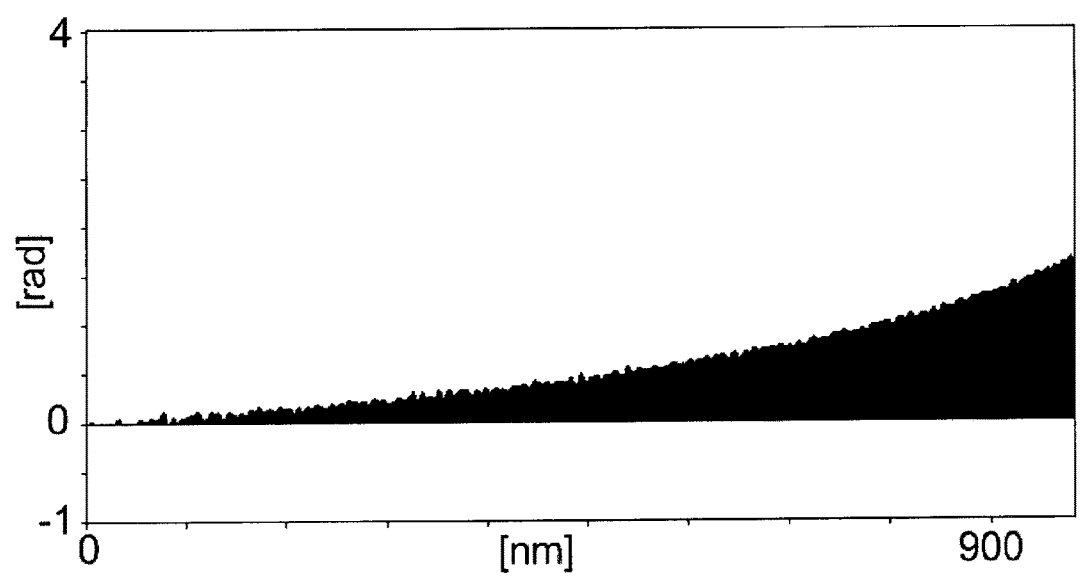
Figure 5C:
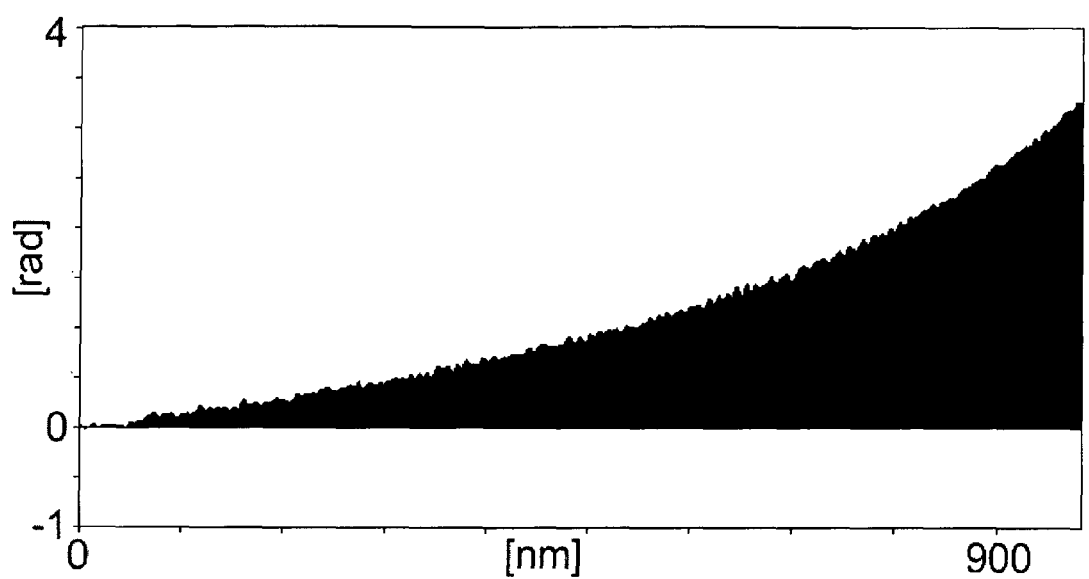

FIGS. 5a, b, c show line scans of the phase through the middles of FIG. 3a, b, c, respectively. The scan proceeds along the section line from A to B that is shown in FIG. 3a. The phase difference, measured on the left-hand axis in radians, is drawn over the distance traveled on that section line, measured on the bottom axis in nanometers. In FIG. 5a, with no magnetic field, there is no phase change, so the line scan only shows a flat line. Comparing FIG. 5c with FIG. 5b, it becomes apparent that the phase increases with about double the slope.

Figure 4A:
FIG. 4: Theoretical simulation of the interferograms shown in FIG. 3.
Figure 4A:
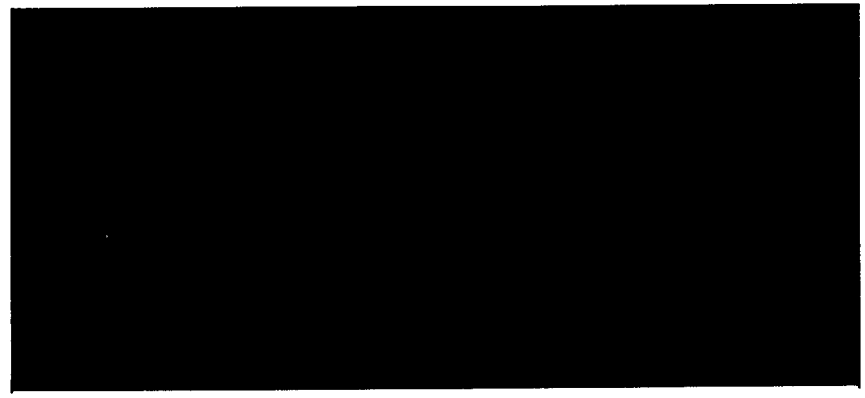
Figure 4B:
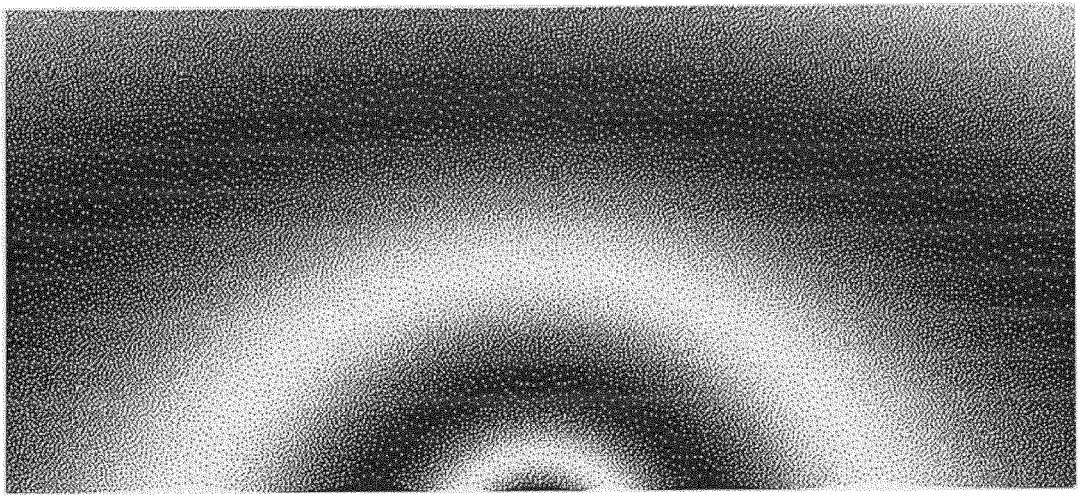
Figure 4B:
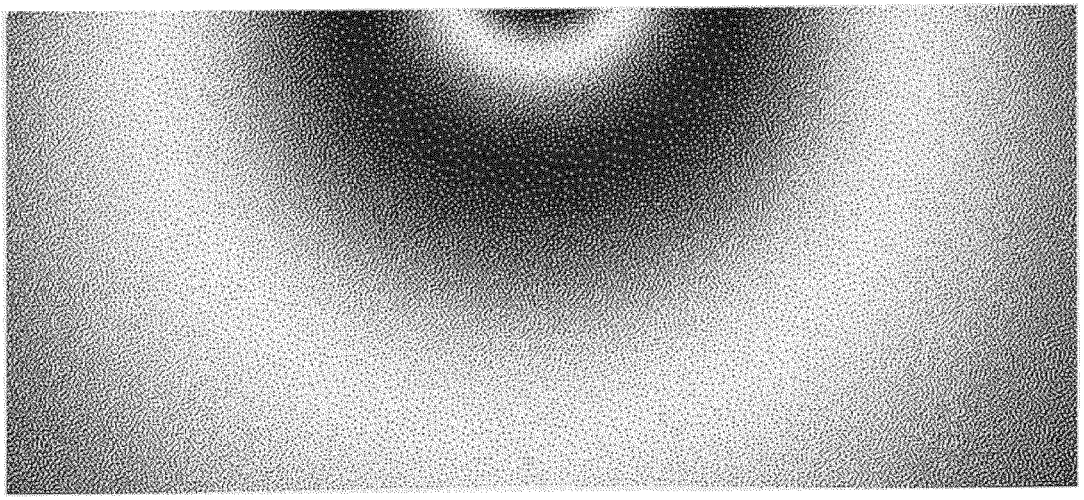
Figure 4C:
Figure 4C:
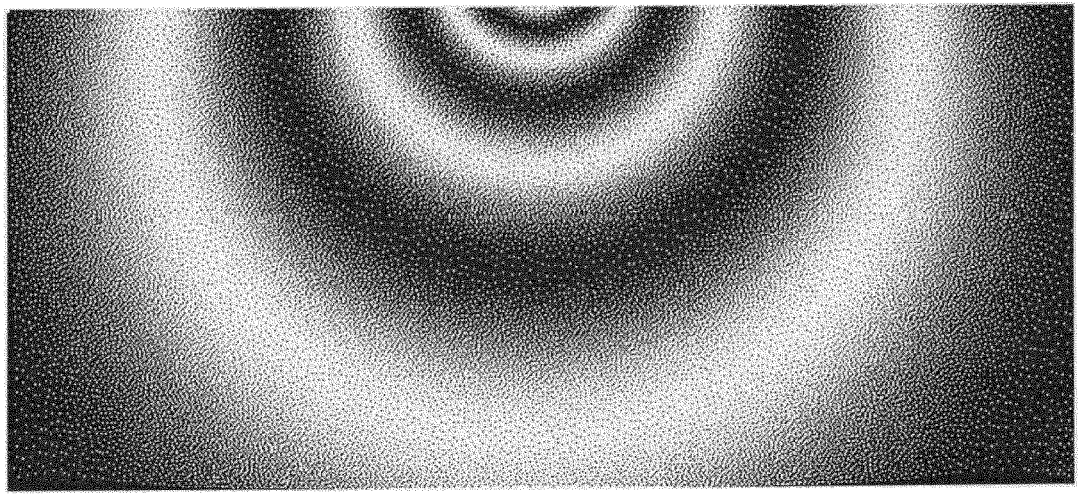
Figure 6A:
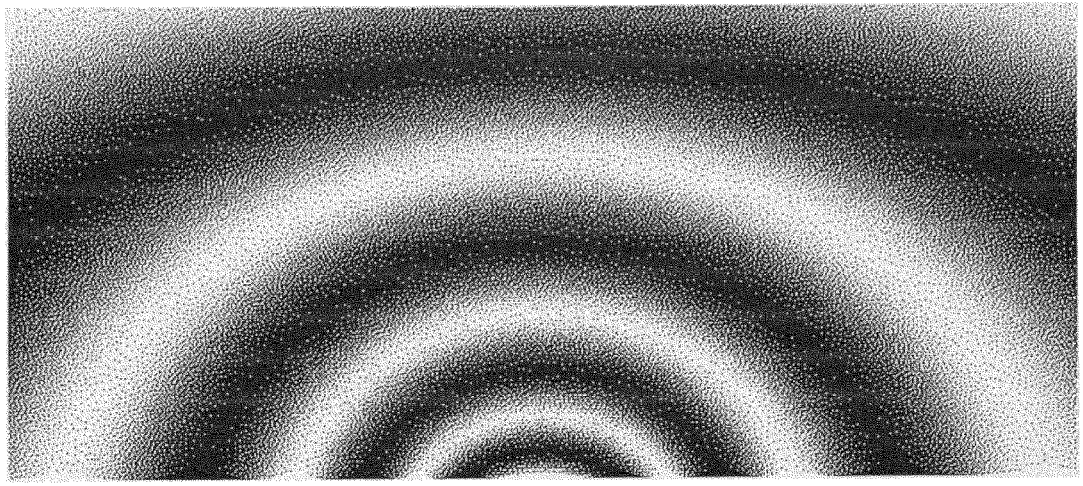
FIG. 6: Theoretical simulation of interferograms with the electron beam tilted by 5° (FIG. 6a), 10° (FIG. 6b) and 15° (FIG. 6c) against the hook arm 1.
Figure 6A:
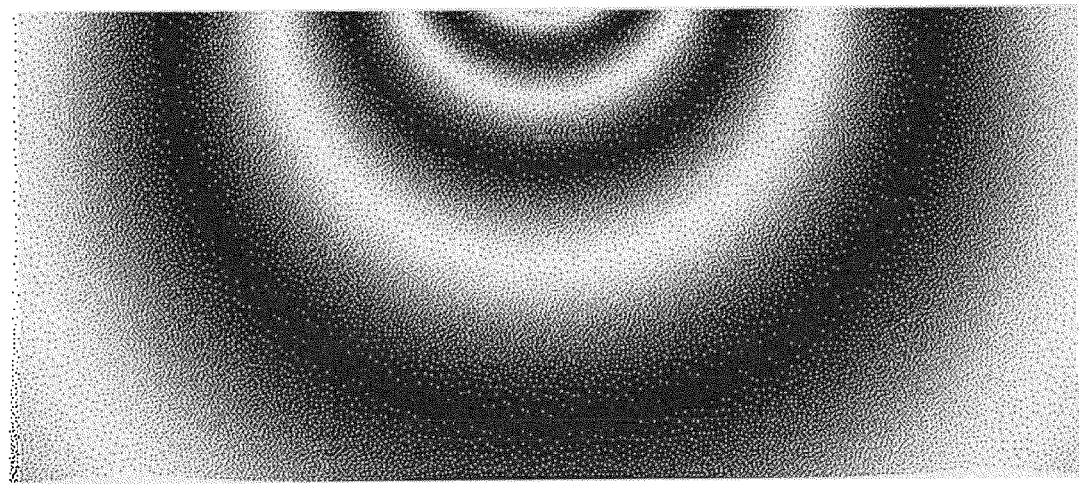
Figure 6B:
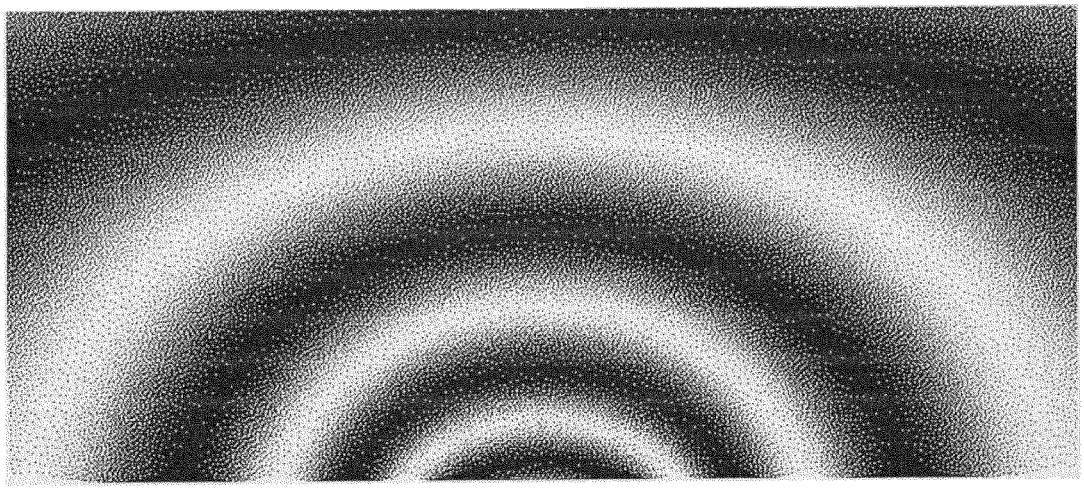
Figure 6B:
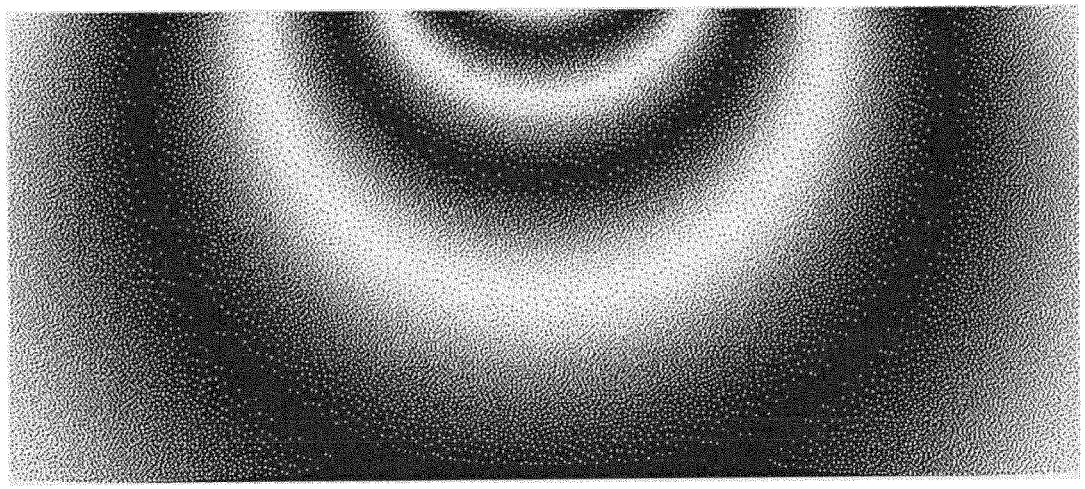
Figure 6C:
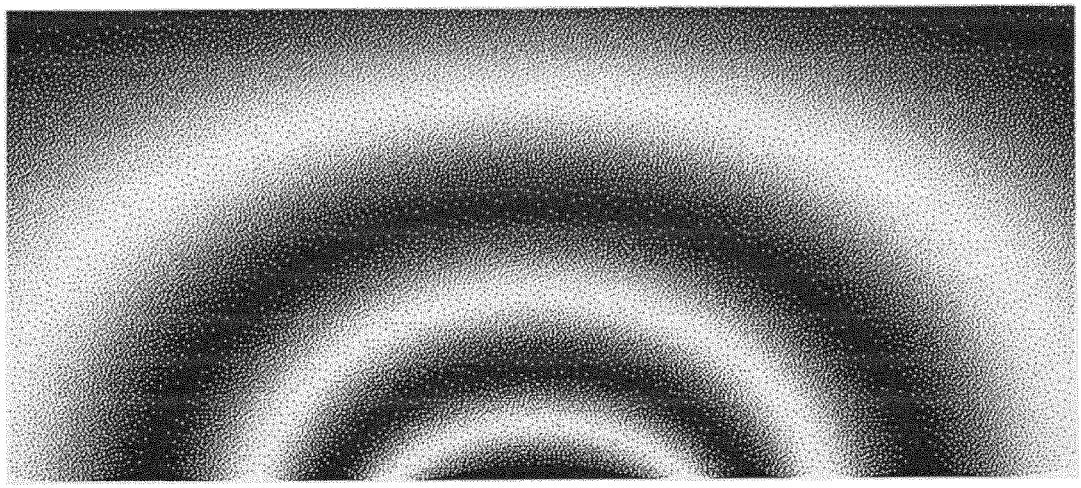
Figure 6C:
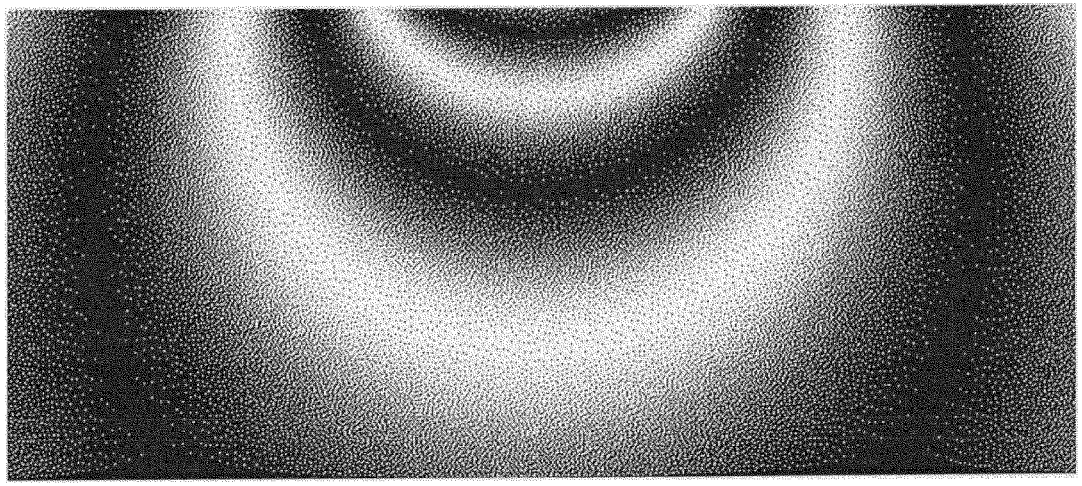

FIG. 6 shows simulations under conditions identical to FIG. 4b, but under the additional assumption that the electron beam has been tilted by 5° (FIG. 6a), 10° (FIG. 6b) or 15° (FIG. 6c). It can be seen that the departure from cylindrical symmetry is acceptable insofar the tilt angle is inferior to 10°. However, an improved version of the phase plate should provide a tilting device for optimal adjustment.

FIG. 7 shows sketches of shapes for phase shifting devices according to the invention. All these shapes are meant to be mounted with respect to the imaging beam so that the imaging beam runs from top to bottom in the drawing plane along the vertical structure 1. FIG. 7a shows the embodiment that was used for the present proof of concept; its concrete realization is shown in FIG. 1 and was subsequently discussed.

Figure 7A:
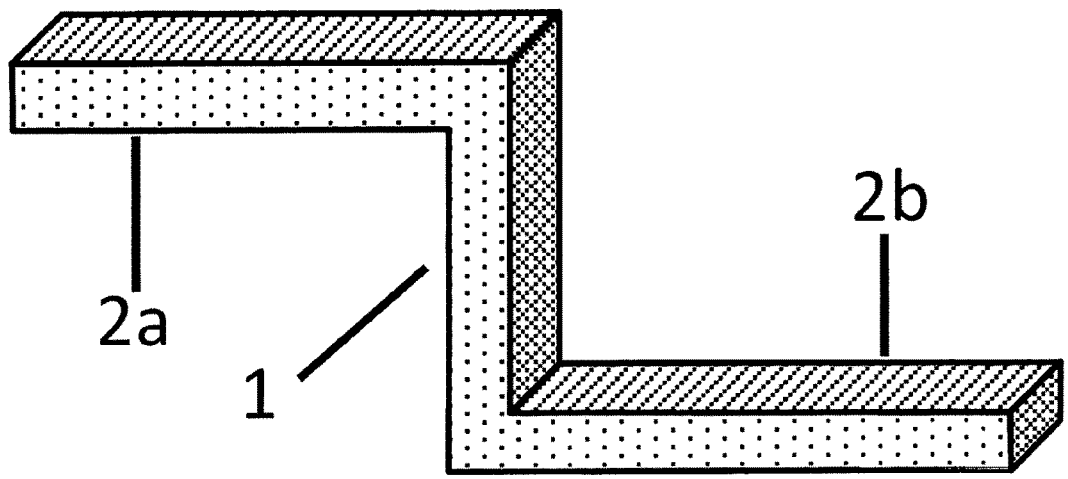
FIG. 7: Some possible shapes for embodiments of phase shifting devices according to the present invention.
Figure 7B:
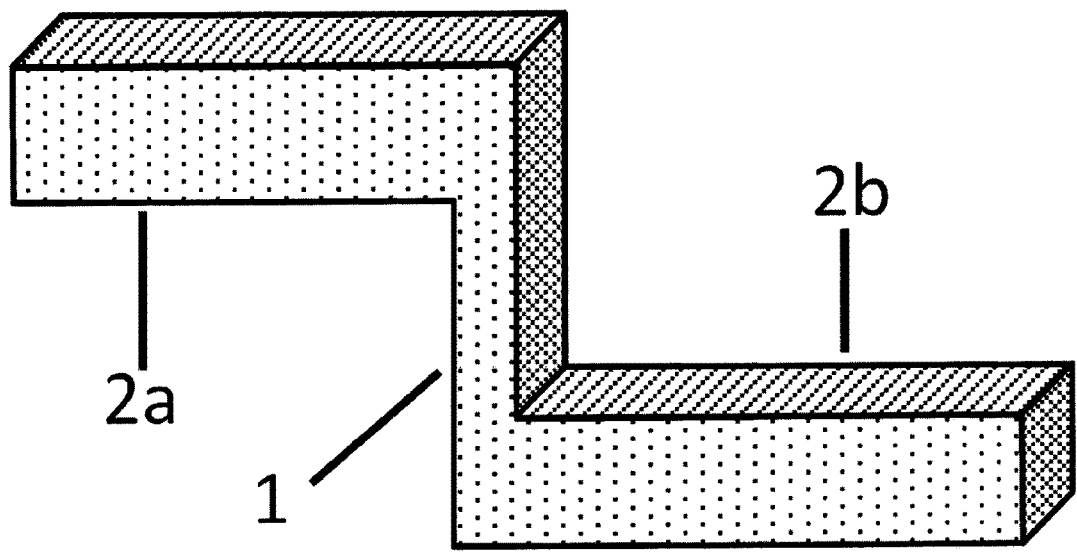

A first refinement is shown in FIG. 7b. In this embodiment, the leads 2a and 2b are twice as strong as in FIG. 7a. This makes the phase shifting device more resistant to breaks when it is mounted in the electron microscope. At the same time, the stronger leads 2 allow a larger current to be driven through the vertical structure 1. This can be used to heat that vertical structure 1.

Figure 7C:
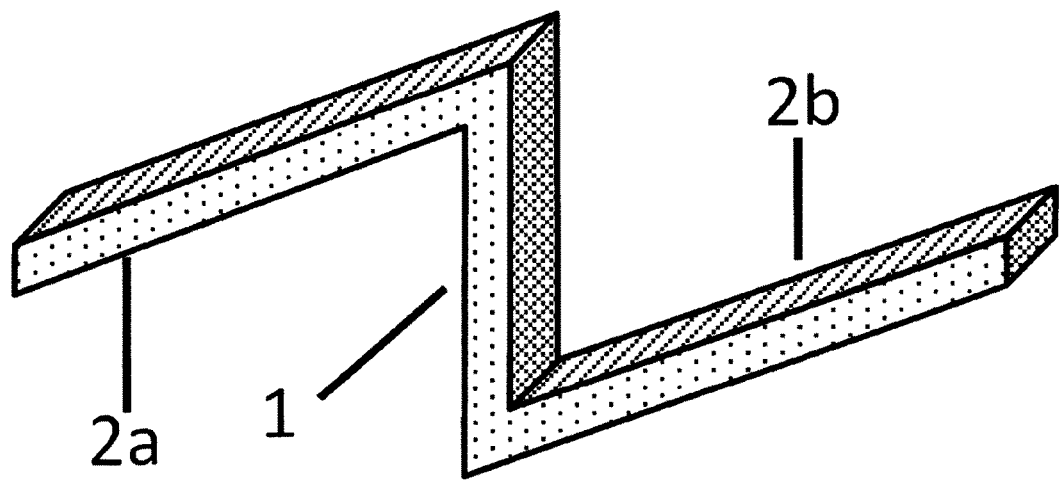

In the embodiment shown in FIG. 7c, the leads 2a, 2b are not perpendicular to the vertical conductor structure 1 and hence also not perpendicular to the imaging beam. The current in the leads 2a, 2b therefore has a vertical component and produces a magnetic field that modifies the main field generated by the vertical conductor structure 1. This is used to fine-tune the field and hence the phase shift.

Figure 7D:
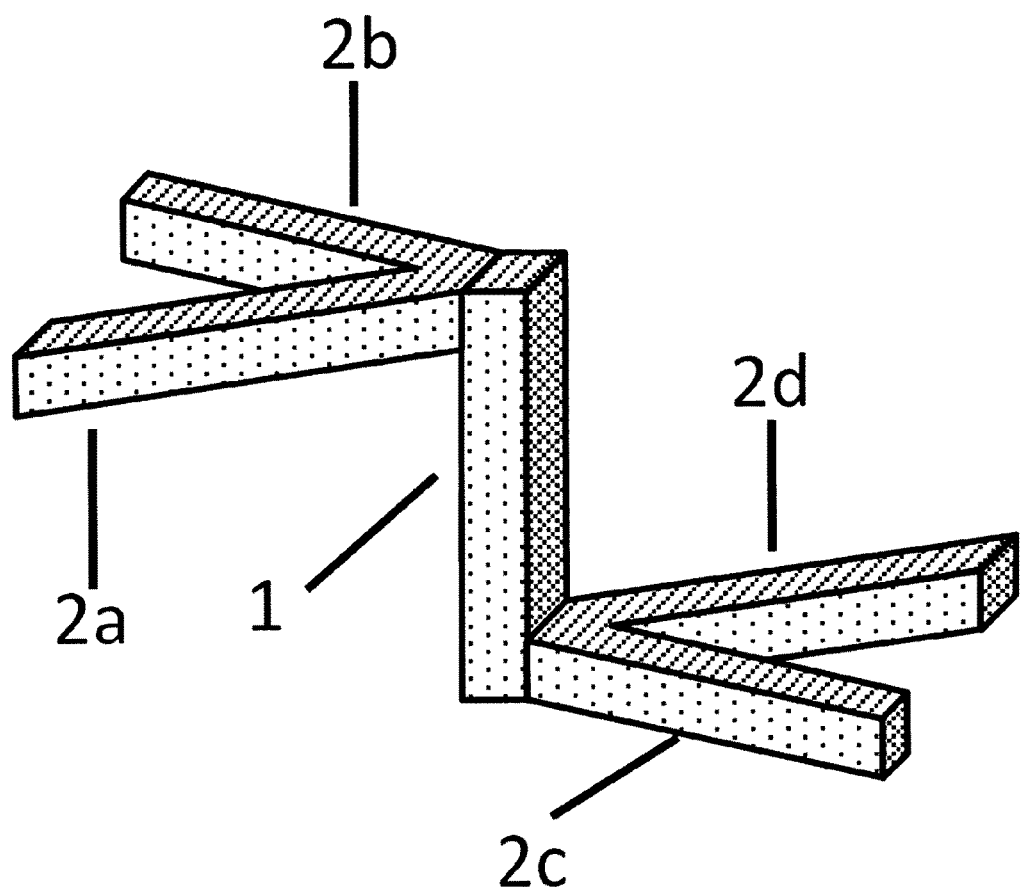

FIG. 7d shows an embodiment where the vertical conductor structure 1 is supplied with currents by multiple leads 2a, 2b, while the current is drawn from it on the return path by multiple leads 2c, 2d as well. The additional leads 2b, 2d per direction both provide mechanical stability of the device for mounting and allow for a stronger current to be passed through the vertical structure 1.

Figure 7E:
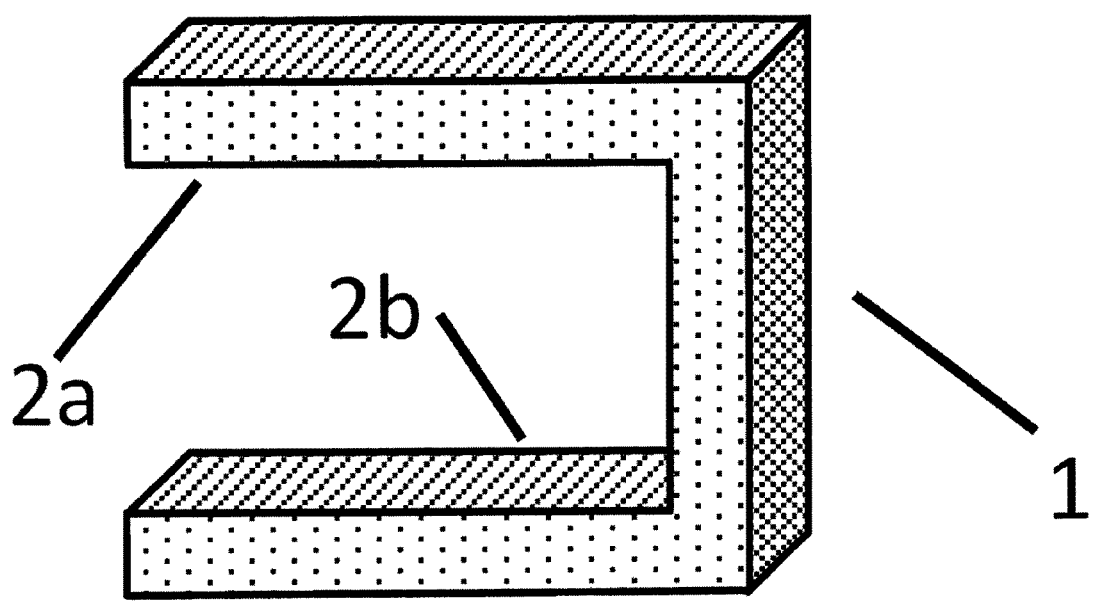

FIG. 7e shows a U-shaped embodiment where the leads 2a and 2b are antiparallel to each other. Advantageously, this embodiment provides the least screening of the beam because it has the smallest cross section. Only the lead 2a and the diameter of the vertical structure 1 contribute to this cross section, while the lead 2b does not.

In principle, analysis of the interference pattern resulting from the holography observations allows the phase shift of the object wave $$\varphi(x, y) = C_E \int_{-\infty}^{\infty} V(x, y, z)dz = \frac{e}{\hbar} \int_{-\infty}^{\infty} A_z(x, y, z)dz \quad (1)$$

to be recovered quantitatively and non-invasively. In Eq. (1), x and y are directions in the plane of the specimen, normal to the electron beam direction z. The contribution of electrostatic field is given by the first term, where CE is an interaction constant that takes a value of $6.53*10^6$ rad V$^{-1}$ m$^{-1}$ at 300 kV and V(x,y,z) is the electrostatic potential within and around the specimen. The contribution of the magnetic field is given by the second term, where $A_z$(x,y,z) is the z-component of the magnetic vector potential and e and ℏ are the absolute values of the electron charge and the reduced Planck constant, respectively.

In order to calculate the phase shift due to the straight section of current-carrying wire, and more generally to a closed loop, the fifth formulation of the Ampere law in terms of the vector potential is very well suited:

$$A = \frac{\mu_0}{4\pi} i \oint \frac{1}{r} dl \quad (2)$$

where $\mu_0 = 4\pi * 10^{-7}$ Vs/Am is the vacuum permeability, i the current and dl the line element.

If we consider a closed loop made by two equal wires of length L aligned with the optical axis, one at the origin and the other far away, let us say at (F,0,0), carrying opposite currents, and connected by horizontal straight wires, we can ascertain that, according to equation (1), the contribution to the electron optical phase shift of the horizontal straight wires is identically zero, whereas that due to the vertical wires gives $$\phi = -\frac{e}{\hbar} \frac{\mu_0}{4\pi} iL(\log[(F-x)^2 + y^2] - \log[x^2 + y^2]) \quad (3)$$

This results from the integration along the optical axis of the vector potential of the straight wire given, for the one at origin (0,0,0), by $$A_z = \frac{\mu_0}{4\pi} i \frac{1}{\sqrt{x^2 + y^2 + z^2}} L \quad (4)$$

Note that this expression for the z component of the vector potential is the same as that of the potential for an elementary charge (Gauss law), and the neutralizing charge or wire at some distance is necessary in order to obtain a finite result, as shown also by Ballossier for the electrostatic case.

Here, as a result of the fact that the vacuum reference wave is perturbed by the stray field from the wire, rather than retrieving the ideal object wavefunction $$\psi(x,y)=\exp(i[\varphi(x,y)]), \qquad (5)$$

electron holography yields information about a fictitious object whose wavefunction is given by the expression $$\psi(x,y)=\exp(i[\varphi(x,y)-\varphi(x+D\cos(\theta),y+D\sin(\theta)]) \qquad (6)$$

where $\theta$ is the angle of the biprism axis with respect to the object and D is the interference distance, which is directly proportional to the biprism potential and should not be confused with the interference field (overlap) width, which also depends on the finite diameter of the electron biprism wire. The value of D can be measured by re-cording two interferograms at different biprism potentials and measuring the variation in distance between recognizable features. The fact that an off-axis electron hologram captures the phase difference between an object and a reference wave has the further advantage that the normalizing contribution to the phase shift is removed.

In general, the problem of removing the effect of a perturbed reference wave from a single recorded electron hologram is unsolved and the only way to access quantitative information from a single phase image is to compare the measured phase shift with a sound physical model of the field under investigation. Alternatively, the effect of the perturbed reference wave can be minimized by increasing the interference distance, for example by using a TEM equipped with two or three biprisms, one of which is in the condenser lens system of the microscope.

The invention claimed is:

1. A phase shifting device for an imaging system comprising a charged particle imaging beam, the phase shifting device comprising a single wire for passing an electric current along a length thereof and in a direction that has a nonzero component parallel to the path of the imaging beam toward a target being imaged by the imaging beam, wherein
   the single wire comprises a conductor structure disposed between at least one first lead and at least one second lead,
   the conductor structure has a length defined between a first end and an opposite second end,
   the at least one first lead is provided at the first end of the conductor structure and extends away from the first end of the conductor structure in a first direction,
   the at least one second lead is provided at the second end of the conductor structure and extends away from the second end of the conductor structure in a second direction, and
   the conductor structure is linear along the length of the conductor structure and is so oriented relative to the imaging beam as to comprise the single wire for passing an electric current in a direction that has a nonzero component parallel to the path of the imaging beam toward a target being imaged by the imaging beam.

2. The phase shifting device according to claim 1, wherein the conductor structure is oriented in a direction that encloses an angle of at most 45 degrees with the path of the imaging beam.

3. The phase shifting device according to claim 2, wherein the at least one first and at least one second leads are disposed at an angle between 75 and 105 degrees with the path of the imaging beam to supply electric current.

4. The phase shifting device according to claim 3, wherein the conductor structure is axially symmetric around the direction of the electric current.

5. The phase shifting device according to claim 3, wherein at least one of the conductor structure and the at least one first and at least one second leads is made of a non-ferromagnetic material.

6. The phase shifting device according to claim 1, wherein
   the at least one first and at least one second leads are arranged antiparallel to each other,
   the first direction and the second direction are the same direction or
   the first direction is opposite with respect to the second direction.

7. The phase shifting device according to claim 1, further comprising:
   a second charged particle beam.

8. The phase shifting device according to claim 1, further comprising a power supply for heating the conductor structure that carries the electric current to at least 200° C.

9. The phase shifting device according to claim 1, wherein a tilt angle between the direction of the electric current and the path of the imaging beam is adjustable.

10. An imaging system configured to provide a charged particle imaging beam that is coherently split into one first part that interacts with an object to be investigated and one second reference part that does not interact with the object, and a phase shifting device in a path of at least one of the two parts of the beam, wherein the phase shifting device is the phase shifting device according to claim 1.

11. The imaging system according to claim 10, wherein the imaging system is an electron microscope.

12. The phase shifting device according to claim 1, wherein the single wire is oriented in a direction that encloses an angle of at most 20 degrees with the path of the imaging beam.

13. The phase shifting device according to claim 1, wherein the single wire is oriented in a direction that encloses an angle of at most 10 degrees with the path of the imaging beam.

* * * * *